US012677561B2

(12) United States Patent
Liu et al.

(10) Patent No.: US 12,677,561 B2
(45) Date of Patent: Jul. 7, 2026

(54) SPLICING DISPLAY SCREEN

(71) Applicant: WUHAN CHINA STAR OPTOELECTRONICS SEMICONDUCTOR DISPLAY TECHNOLOGY CO., LTD., Wuhan (CN)

(72) Inventors: Na Liu, Wuhan (CN); Wenxu Xianyu, Wuhan (CN); Yongsup Hwang, Wuhan (CN); Seongkee Park, Wuhan (CN); Chunpeng Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 439 days.

(21) Appl. No.: 17/623,768

(22) PCT Filed: Dec. 24, 2021

(86) PCT No.: PCT/CN2021/141300
§ 371 (c)(1),
(2) Date: Jun. 29, 2023

(87) PCT Pub. No.: WO2023/115557
PCT Pub. Date: Jun. 29, 2023

(65) Prior Publication Data
US 2024/0049546 A1      Feb. 8, 2024

(30) Foreign Application Priority Data

Dec. 20, 2021      (CN) .......................... 202111566804.4

(51) Int. Cl.
H10K 59/18 (2023.01)
G09G 3/20 (2006.01)
(Continued)

(52) U.S. Cl.
CPC ........... H10K 59/18 (2023.02); G09G 3/2096 (2013.01); G09G 3/3225 (2013.01);
(Continued)

(58) Field of Classification Search
CPC .... H10K 59/18; H10K 59/131; G09G 3/2096; G09G 3/3225; G06F 3/1446; G06F 3/1423; G06F 3/1431
See application file for complete search history.

(56) References Cited

U.S. PATENT DOCUMENTS 12,310,188 B2 *   5/2025   Xu ........................ H10K 59/131
2015/0221712 A1   8/2015   Yu et al.
(Continued)

FOREIGN PATENT DOCUMENTS

CN      103700319 A      4/2014
CN      103918021 A      7/2014
(Continued)

OTHER PUBLICATIONS

International Search Report in International application No. PCT/CN2021/141300, mailed on Sep. 15, 2022.
(Continued)

*Primary Examiner* — Sardis F Azongha
(74) *Attorney, Agent, or Firm* — PV IP PC; Christopher S. Ruprecht; Wei Te Chung

(57) ABSTRACT

A splicing display screen defined with a plurality of sub-areas is provided. The splicing display screen includes a first substrate, a first metal layer, a plurality of driving ICs, a control unit, and a plurality of display screen units. The first metal layer is disposed on the first substrate, and each driving IC is buried in a groove of a corresponding sub-area and is electrically connected to a circuit of the first metal layer. The control unit is electrically connected to the plurality of driving ICs, and the plurality of display screen
(Continued)

units correspond to the plurality of sub-areas in a one-to-one manner. The plurality of display screen units are disposed on the first metal layer and electrically connected to the first metal layer.

10 Claims, 4 Drawing Sheets

(51) Int. Cl.
  *G09G 3/3225*      (2016.01)
  *H10K 59/131*      (2023.01)
(52) U.S. Cl.
  CPC ..... *H10K 59/131* (2023.02); *G09G 2300/026* (2013.01); *G09G 2320/0223* (2013.01); *G09G 2360/04* (2013.01)

(56)                References Cited

U.S. PATENT DOCUMENTS

| | | |
|---|---|---|
| 2017/0178586 A1 | 6/2017 | Kim et al. |
| 2020/0176419 A1 | 6/2020 | Dabral et al. |

FOREIGN PATENT DOCUMENTS

| | | | | |
|---|---|---|---|---|
| CN | 106298837 A | | 1/2017 | |
| CN | 208027056 U | | 10/2018 | |
| CN | 111261057 A | | 6/2020 | |
| CN | 111584579 A | | 8/2020 | |
| CN | 111627382 A | * | 9/2020 | ............... G09G 3/32 |
| CN | 111951697 A | | 11/2020 | |
| CN | 112185984 A | | 1/2021 | |
| CN | 214313208 U | | 9/2021 | |
| CN | 113707827 A | * | 11/2021 | ......... H10K 50/8445 |

OTHER PUBLICATIONS

Written Opinion of the International Search Authority in International application No. PCT/CN2021/141300, mailed on Sep. 15, 2022.

Chinese Office Action issued in corresponding Chinese Patent Application No. 202111566804.4 dated Aug. 8, 2022, pp. 1-11.

* cited by examiner

21

SPLICING DISPLAY SCREEN

FIELD OF INVENTION

The present invention relates to a field of display technology, particularly relates to a splicing display screen that can realize seamless splicing.

BACKGROUND OF INVENTION

With development of display technology, industry's requirements for a size and appearance of display devices are becoming more and more diversified. In order to maximize a screen size and meet the needs of special-shaped displays, a concept and application of splicing multiple displays have gradually emerged. At present, large-sized display screens that have been mass-produced on market have a low yield and a high production cost. By splicing multiple display screens to realize a large-sized display screen, it is not restricted by a manufacturing process. In addition, splicing of special-shaped display screens can be realized.

Technical Problem

The current display splicing technology still has technical problems such as visually visible splicing gaps and poor driving display effects. Therefore, the aforesaid technical problems in the current display screen splicing technology need to be further solved.

SUMMARY OF INVENTION

In order to solve the aforesaid technical problems, the present invention proposes a splicing display screen. The splicing display screen is defined with a plurality of sub-areas, each sub-area is correspondingly provided with a display screen unit and a driving IC, and each driving IC is disposed in the groove located on the sub-area of the splicing display screen. Furthermore, each driving IC is electrically connected to each display screen unit through via-holes in the film layer to drive the display screen unit, thereby realizing seamless splicing of the display screen units without increasing the thickness of the splicing display screen. In addition, each display screen unit is provided with a corresponding driving IC, the driving ICs in the same row or column are connected in series to form multiple driving IC rows or driving IC columns. Each of the drive IC rows or the drive IC columns are respectively connected to the control unit. This can reduce a risk of IR Drop of large-sized splicing displays and improve the display effect.

The present invention proposes a splicing display screen. The splicing display screen is defined with a plurality of sub-areas, and including: a first substrate; a first metal layer disposed on the first substrate; a plurality of driving ICs, wherein each driving IC corresponds to a sub-area, is disposed on the first substrate, and electrically connected to a circuit of the first metal layer; a control unit electrically connected to the plurality of driving ICs; and a plurality of display screen units, wherein the plurality of display screen units correspond to the plurality of sub-areas in a one-to-one manner. The plurality of display screen units are disposed on the first metal layer and electrically connected to the first metal layer.

The splicing display screen according to an embodiment of the present invention further includes a first flexible support layer disposed between the first substrate and the first metal layer, and a first insulating layer disposed on the first metal layer.

The splicing display screen according to an embodiment of the present invention, wherein each sub-area is defined with a groove, the groove penetrates the first insulating layer, the first metal layer, and at least part of the first flexible support layer, and wherein each driving IC is disposed in a corresponding groove.

The splicing display screen according to an embodiment of the present invention, wherein each sub-area further includes: a first metal pad, wherein the first metal pad is disposed on the first insulating layer and is electrically connected to the first metal layer through a first via hole penetrating the first insulating layer; and a second metal pad, wherein the second metal pad is led out from a bottom of each display screen unit; wherein the first metal pad and the second metal pad are connected in a one-to-one manner to conduct the plurality of display screen units and the plurality of driving ICs.

The splicing display screen according to an embodiment of the present invention further includes a glue layer filling the groove and a gap between the display screen unit and the first insulating layer.

The splicing display screen according to an embodiment of the present invention, wherein the plurality of driving ICs in the same row are connected in series to form at least two driving IC rows, and each of the at least two driving IC rows is respectively electrically connected to the control unit.

The splicing display screen according to an embodiment of the present invention, wherein the display screen unit includes: a second substrate; a second metal layer disposed on the second substrate; a thin film transistor device layer disposed on the second metal layer; a light-emitting device layer disposed on the thin film transistor device layer; and an encapsulation layer disposed on the light-emitting device layer; wherein the second metal pad is electrically connected to the second metal layer through an opening on the second substrate, and the second metal layer is electrically connected to the thin film transistor device layer through a third via hole.

The present invention further provides another splicing display screen defined with a plurality of sub-areas, wherein the splicing display screen includes: a first substrate; a first flexible support layer disposed on the first substrate; a first metal layer disposed on the first flexible support layer; a plurality of driving ICs, wherein each driving IC corresponds to a sub-area, is disposed on the first flexible support layer, and electrically connected to a circuit of the first metal layer; a control unit electrically connected to the plurality of driving ICs; a first insulating layer disposed on the first metal layer; a second flexible support layer disposed on the first insulating layer; a second insulating layer disposed on the second flexible support layer; and a plurality of display screen units, wherein the plurality of display screen units correspond to the plurality of sub-areas in a one-to-one manner, and the plurality of display screen units are disposed on the second insulating layer and electrically connected to the first metal layer.

The splicing display screen according to an embodiment of the present invention, wherein each sub-area is defined with a groove, the groove penetrates the second insulating layer, the second flexible support layer, the first insulating layer, the first metal layer, and at least part of the first flexible support layer, and wherein each driving IC is disposed in a corresponding groove.

The splicing display screen according to an embodiment of the present invention, wherein each sub-area further includes: a first metal pad disposed on the second insulating layer and is electrically connected to the first metal layer through a second via hole penetrating the second insulating layer, the second flexible support layer, and the first insulating layer; and a second metal pad, wherein the second metal pad is led out from the bottom of each display screen unit; wherein the first metal pad and the second metal pad are connected in a one-to-one manner to conduct the plurality of display screen units and the plurality of driving ICs.

The splicing display screen according to an embodiment of the present invention further includes a glue layer filling the groove and a gap between the display screen unit and the first insulating layer.

The splicing display screen according to an embodiment of the present invention, wherein the plurality of driving ICs in the same row are connected in series to form at least two driving IC rows, and each of the at least two driving IC rows is respectively electrically connected to the control unit.

The splicing display screen according to an embodiment of the present invention, wherein the display screen unit includes: a second substrate; a second metal layer disposed on the second substrate; a thin film transistor device layer disposed on the second metal layer; a light-emitting device layer disposed on the thin film transistor device layer; and an encapsulation layer disposed on the light-emitting device layer; wherein the second metal pad is electrically connected to the second metal layer through an opening on the second substrate, and the second metal layer is electrically connected to the thin film transistor device layer through a third via hole.

Beneficial Effect

In the present invention, by burying each driving IC in the groove of the corresponding splicing display screen sub-area, the seamless splicing of multiple display screen units can be realized without increasing the overall thickness of the splicing display screen. It can prevent the driving IC from being exposed to the air and being corroded and oxidized by water vapor. In addition, each display screen unit is provided with a corresponding driving IC, and the driving ICs in the same row or column are connected in series to form multiple driving IC rows or driving IC columns, and each of the multiple driving IC rows or driving IC columns is respectively connected to the control unit. This can reduce a risk of IR Drop of a large-sized splicing display and improve the display effect.

DETAILED DESCRIPTION OF PREFERRED EMBODIMENTS

Figure 1:
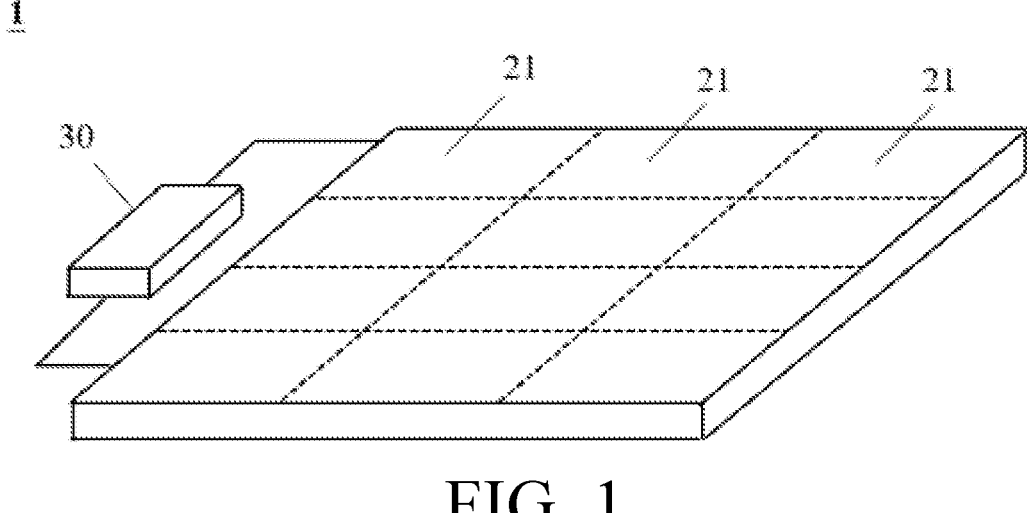
FIG. 1 is a schematic diagram of a three-dimensional structure of a splicing display screen according to an embodiment of the present invention.

The splicing display screen proposed by the embodiments of the present invention will be described in detail with reference to the accompanying drawings. Obviously, the embodiments are only a part of the embodiments of the present invention, rather than all the embodiments. Based on these embodiments of the present invention, all other embodiments obtained by those of ordinary skill in the art without doing creative work shall fall within the protection scope of the present invention.

The description of the following embodiments refers to the attached drawings to illustrate specific embodiments in the present application. The directional terms mentioned in the present invention, such as "above", "below", "front", "back", "left", "right", "inside", "outside", "side", etc., are only directions for referring to the attached drawings. Therefore, the directional terms are used to describe and understand the present invention, rather than limit the present invention. In the drawings, units with similar structures are denoted by the same reference numerals. In the drawings, for clear understanding and ease of description, the thickness of some layers and regions are exaggerated. That is, the size and thickness of each component shown in the drawings are arbitrarily shown, but the present application is not limited thereto.

Figure 2:
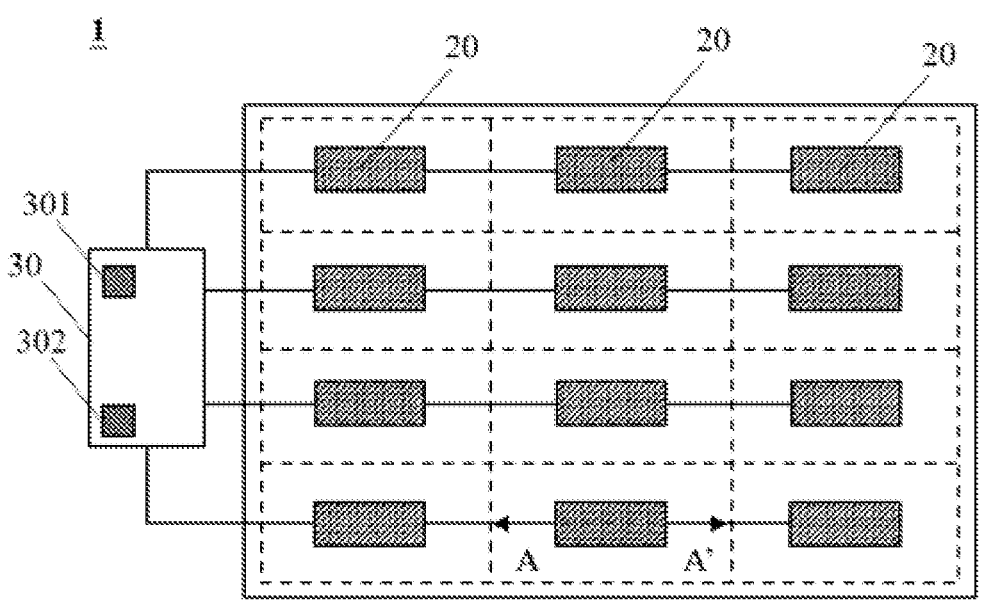
FIG. 2 is a top perspective schematic view of the splicing display screen shown in FIG. 1 of the present invention.

Please refer to FIG. 1 and FIG. 2. FIG. 1 is a schematic diagram of a three-dimensional structure of a splicing display screen according to an embodiment of the present invention, and FIG. 2 is a top perspective schematic view of the splicing display screen shown in FIG. 1 of the present invention. As shown in FIG. 1, the splicing display screen 1 proposed by the embodiment of the present invention is defined with a plurality of sub-areas (represented by dotted squares). The splicing display screen 1 includes a plurality of display screen units 21 and a control unit 30, and the plurality of display screen units 21 correspond to the plurality of sub-areas in a one-to-one manner. As shown in FIG. 2, the splicing display screen 1 further includes a plurality of driving ICs 20, and each driving IC 20 is correspondingly disposed in a sub-area. In the embodiment of the present invention, the driving ICs 20 in the same row are connected in series to form a plurality of driving IC rows, and each of the plurality of driving IC rows is electrically connected to the control unit 30 respectively. Specifically, the control unit 30 is a logic board, and the logic board includes a graphics display data memory 301 and a controller 302. The graphic display data memory 301 is configured to convert an input signal into an image signal and input the image signal, timing, and voltage to the driving IC 20 in the same column or the same row through the controller 302.

In this embodiment, each sub-area of the splicing display screen 1 is provided with a display screen unit 21 and a driving IC 20 correspondingly. The driving ICs 20 in the same row are connected in series to form a plurality of driving IC rows, and each of the plurality of driving IC rows is respectively electrically connected to the control unit 30, which can reduce the risk of IR Drop of the large-sized splicing display screen, thereby improving the display effect.

Figure 3:
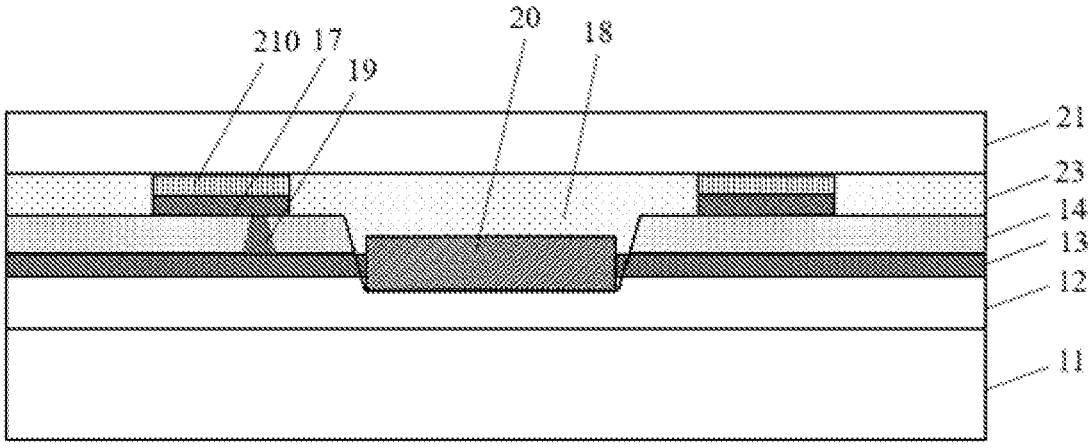
FIG. 3 is a schematic diagram of a cross-sectional structure of a sub-area of a splicing display screen according to a first embodiment of the present invention.

Please refer to FIG. 3. FIG. 3 is a schematic diagram of a cross-sectional structure of a sub-area of a splicing display screen according to a first embodiment of the present invention (the cross-section is taken along the line A-A' in FIG. 2). As shown in FIG. 3, a sub-area of the splicing display screen of the first embodiment of the present invention includes a first substrate 11, a first flexible support layer 12, a first metal layer 13, a first insulating layer 14, a driving IC 20, a glue layer 23, and a display screen unit 21. The first flexible support layer 12 is disposed on the first substrate 11, the first metal layer 13 is disposed on the first flexible support layer 12, the first insulating layer 14 is disposed on the first metal layer 13, and the glue layer 23 is disposed on the first insulating layer 14.

In the splicing display screen, each sub-area corresponds to a groove 18. The groove 18 penetrates the first insulating layer 14, the first metal layer 13, and at least part of the first flexible support layer 12. The driving IC 20 is buried in the groove 18, and the driving IC 20 is electrically connected to the circuit in the first metal layer 13. The glue layer 23 fills the groove 18 and the gap between the display screen unit 21 and the first insulating layer 14.

Preferably, the glue layer 23 may include epoxy resin. The glue layer 23 is used as an encapsulant to seal the groove 18 and the gap between the display screen unit 21 and the first insulating layer. In addition, it also has the function of fastening the display screen unit 21.

Wherein, a sub-area of the splicing display screen further includes a first metal pad 17 and a second metal pad 210. The first metal pad 17 is disposed on the first insulating layer 14 and is electrically connected to the first metal layer 13 through a first via hole 19 penetrating the first insulating layer 14, and the second metal pad 210 is led out from the bottom of each display screen unit 21. Wherein, the first metal pad 17 and the second metal pad 210 are connected in a one-to-one manner to conduct the plurality of display screen units 21 and the plurality of driving ICs 20 to realize the driving of each display unit 21 by each driving IC 20.

Specifically, the manufacturing process of the splicing display screen is as follows: coating a polyimide (PI) solution on a glass substrate 11 to form a first flexible support layer 12, wherein the thickness of the coated first flexible support layer 12 is 6 μm or more; forming a first metal layer 13 on the first flexible support layer 12 through a physical vapor deposition (PVD) process with a deposition thickness of about 250 nm; then, patterning the first metal layer 13 by photolithography processes such as photoresist coating, exposure, development, and etching; forming a first insulating layer 14 on the first metal layer 13 by a plasma-enhanced chemical vapor deposition method; defining a first via hole 19 on the first insulating layer 14 by a dry etching method, such as a laser drilling process, for electrically connecting the first metal pad 17 and the first metal layer 13; forming a first metal pad 17 on the first insulating layer 14 by a physical vapor deposition method, and electrically connecting the first metal pad 17 to the first metal layer 13 through the first via hole 19; defining a groove 18 between two metal pads 17 by a dry etching method such as a laser drilling process, wherein the groove 18 penetrates the first insulating layer 14, the first metal layer 13, and at least part of the first flexible support layer 12; and bonding the driving IC 20 to the groove 18. Specifically, the driving IC 20 is bonded to the flexible support layer 12 through an adhesive, and the pins of the driving IC 20 are connected to the first metal layer 13 through a wire bonding process.

In this embodiment, each driving IC is buried in the groove of the corresponding splicing display screen sub-area, which can realize seamless splicing of multiple display screen units without increasing the overall thickness of the splicing display screen. In addition, it can prevent the driving IC from being exposed to the air and being corroded and oxidized by water vapor.

Figure 4:
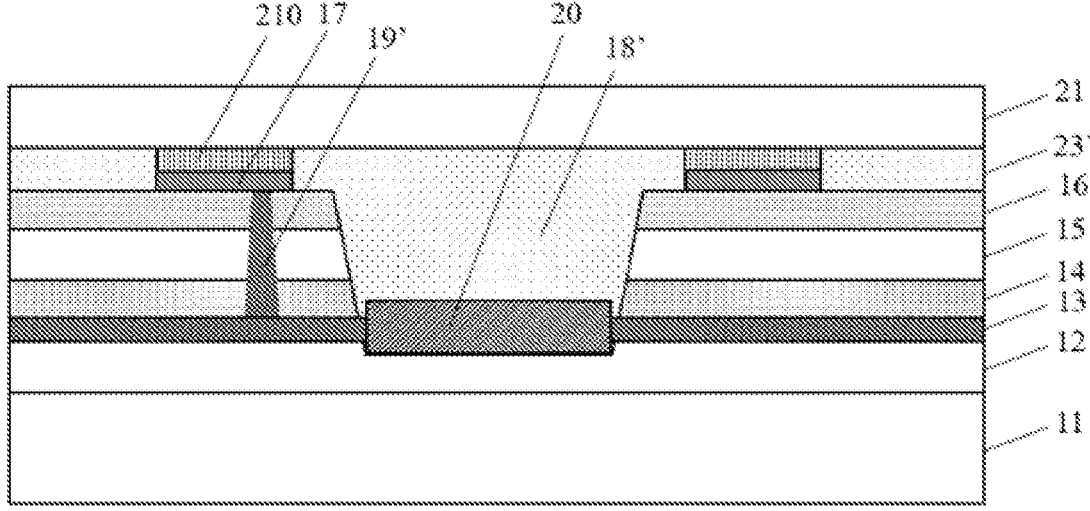
FIG. 4 is a schematic diagram of a cross-sectional structure of a sub-area of a splicing display screen according to a second embodiment of the present invention.

FIG. 4 is a schematic diagram of a cross-sectional structure of a sub-area of a splicing display screen according to a second embodiment of the present invention. As shown in FIG. 4, in the second embodiment of the present invention, a sub-area of the splicing display screen includes: a first substrate 11, a first flexible support layer 12, a first metal layer 13, a first insulating layer 14, a second flexible support layer 15, a second insulating layer 16, a driving IC 20, a glue layer 23', and a display screen unit 21. The first flexible support layer 12 is disposed on the first substrate 11. The first metal layer 13 is disposed on the first flexible support layer 12. The first insulating layer 14 is disposed on the first metal layer 13. The second flexible support layer 15 is disposed on the first insulating layer 14. The second insulating layer 16 is disposed on the second flexible support layer 15. The glue layer 23' is disposed on the second insulating layer 16.

In the splicing display screen, each sub-area is correspondingly defined with a groove 18', and the groove 18' penetrates the second insulating layer 16, the second flexible support layer 15, the first insulating layer 14, the first metal layer 13, and at least part of the first flexible support layer 12, and wherein the driving IC 20 is embedded on the first flexible support layer 12 in the groove 18'. The driving IC 20 is electrically connected to the circuits in the first metal layer 13, and the glue layer 23' fills the groove 18' and the gap between the display screen unit 21 and the second insulating layer 16.

Preferably, the glue layer 23' may include epoxy resin. The glue layer 23' is used as an encapsulant to seal the groove 18' and the gap between the display screen unit 21 and the first insulating layer. In addition, it also has the function of fastening the display screen unit 21.

Wherein, a sub-area of the splicing display screen further includes a first metal pad 17 and a second metal pad 210. The first metal pad 17 is disposed on the second insulating layer 16 and is electrically connected to the first metal layer 13 through a second via hole 19' penetrating the second insulating layer 16, the second flexible support layer 15, and the first insulating layer 14, and the second metal pad 210 is led out from the bottom of each display screen unit 21. Wherein, the first metal pad 17 and the second metal pad 210 are connected in a one-to-one manner to conduct the plurality of display screen units 21 and the plurality of driving ICs 20 to realize the driving of each display unit 21 by each driving IC 20.

Compared with the first embodiment, in this embodiment, the second flexible support layer 15 and the second insulating layer 16 are introduced to further improve the reliability of the splicing display screen, which can further prevent the intrusion of water vapor into the film layer and cause the circuit to oxidize.

Figure 5:
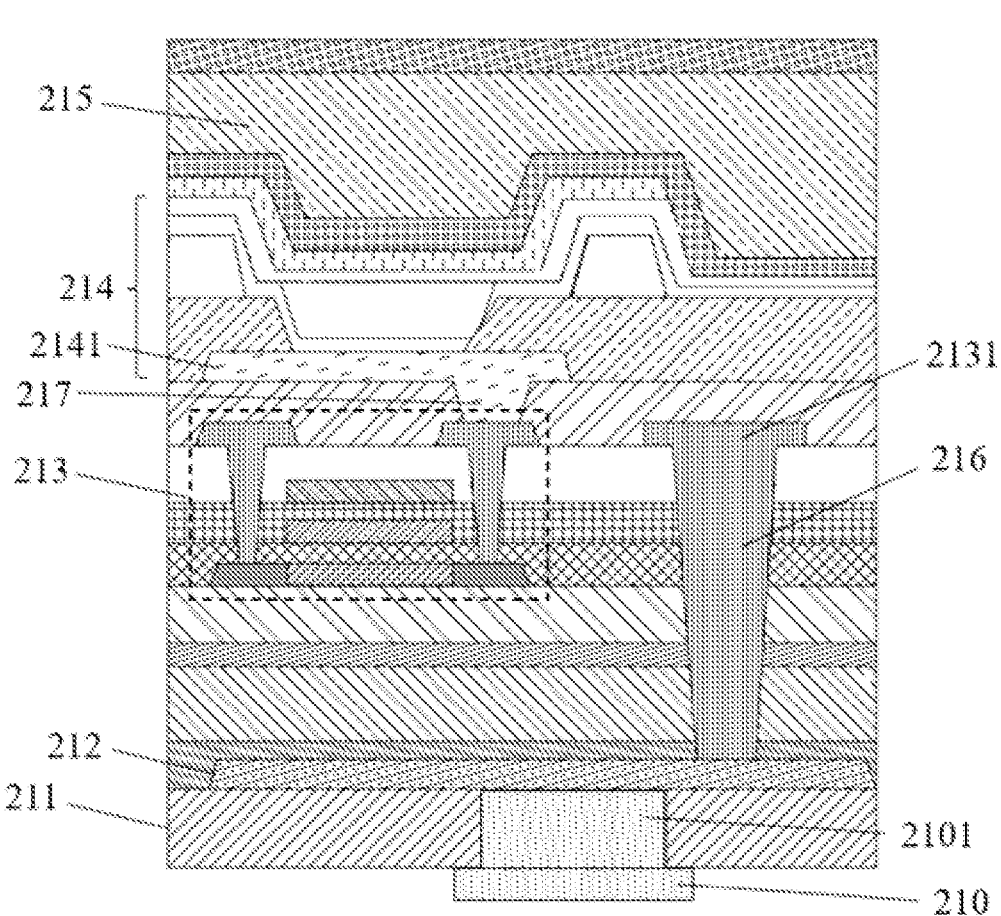
FIG. 5 is a schematic diagram of a cross-sectional structure of a display screen unit according to an embodiment of the present invention.

Please refer to FIG. 5. FIG. 5 is a schematic diagram of a cross-sectional structure of a display screen unit according to an embodiment of the present invention. As shown in FIG. 5, the display unit of the embodiment of the present invention is an organic light-emitting diode (OLED) display unit.

The OLED display screen unit proposed by the embodiment of the present invention includes a second substrate 211, a second metal pad 210, a second metal layer 212, a thin film transistor device layer 213, an organic light-emitting device layer 214, and an encapsulation layer 215. Wherein, the second metal pad 210 is disposed on the bottom surface of the second substrate 211, the second metal layer 212 is disposed on the second substrate 211, the thin film transistor device layer 213 is disposed on the second metal layer 212, the organic light-emitting device layer 214 is disposed on the thin film transistor device layer 213, and the encapsulation layer 215 is disposed on the organic light-emitting device layer 214. Specifically, the thin film transistor device layer 213 includes a polysilicon layer, a first gate layer, a second gate layer, and a source/drain metal layer 2131. Specifically, the organic light-emitting device layer 214 of the OLED display screen unit includes an anode layer 2141, a hole transport layer or an electron transport layer disposed on the anode layer 2141, an organic light-emitting layer disposed on the anode layer 2141 and the hole transport layer (or electron transport layer), a capping layer disposed on the organic light-emitting layer, and a cathode layer disposed on the cover layer. Specifically, the encapsulation layer 215 includes a silicon oxynitride (SiON) film layer or a silicon nitride (SiN) film layer disposed on the cathode layer, an organic buffer layer (Acrylic/HMDSO) disposed on the silicon oxynitride film layer or the silicon nitride film layer, and a silicon oxynitride (SiON) film layer disposed on the organic buffer layer.

Preferably, the second metal pad 210 is formed by filling or dispensing a conductive adhesive. For example, it is formed by dispensing an epoxy conductive adhesive into the opening 2101 of the second substrate 211 and causing the epoxy conductive adhesive to extend to the outer surface of the second substrate 211.

Wherein, the second metal pad is electrically connected to the second metal layer 212 through the opening 2101 of the second substrate 211. The second metal layer 212 is electrically connected to the source/drain metal layer 2131 of the thin film transistor device layer 213 through the third via hole 216, and is further electrically connected to the anode layer 2141 in the organic light-emitting device layer 214 through the fourth via hole 217.

In the embodiment of the present invention, the display screen unit 21 is defined with an opening 2101 on the surface of the second substrate 211 to expose the second metal layer 212 and the opening 2101 is filled with a conductive adhesive, and the conductive adhesive overflows to the surface of the second substrate 211 to form a second metal pad 210. The second metal pad 210 is configured to be electrically connected with the first metal pad 17 (please refer to FIG. 3 or FIG. 4 together) to realize the conduction between each display screen unit 21 and each driving IC 20.

Figure 6:
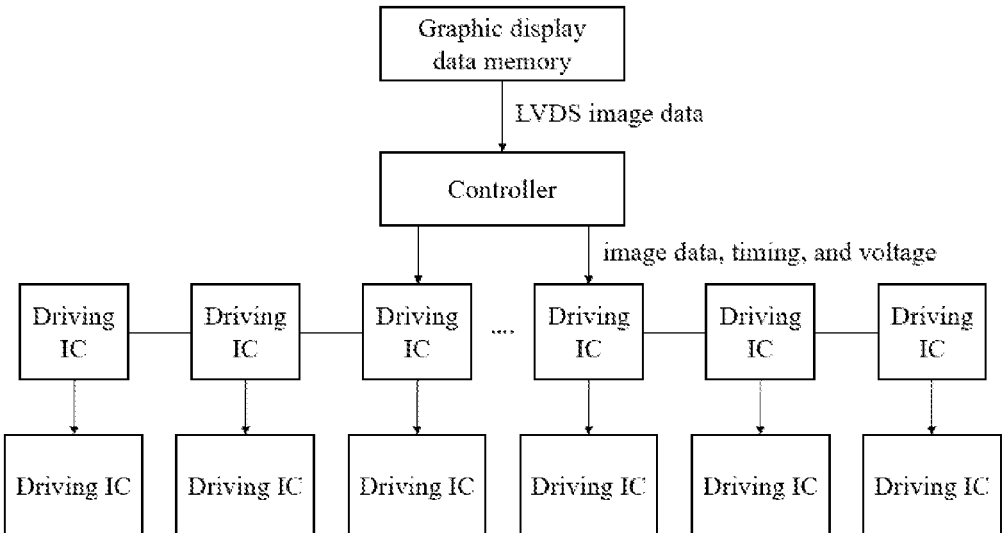
FIG. 6 is a schematic structural diagram of a control unit according to an embodiment of the present invention.

Please refer to FIG. 6. FIG. 6 is a schematic structural diagram of a control unit according to an embodiment of the present invention. As mentioned above, the control unit proposed by the embodiment of the present invention is a logic board. In the splicing display screen proposed by the embodiment of the present invention, the driving ICs located in the same row or in the same column are connected in series to form a plurality of driving IC rows or driving IC columns. Each of the plurality of driving IC rows or driving IC columns is respectively connected to the control unit. As shown in FIG. 6, the control unit is a logic board, and the logic board includes a graphic display data memory 301 and a controller 302 (please refer to FIG. 2). The graphic display data storage 301 is configured to convert an input signal into an image signal, for example, a low-voltage differential signaling (LVDS) image. The controller 302 inputs the image signal, timing, and voltage to the driving ICs in the same column or the same row, and the driving ICs are connected to the display screen unit to drive the display screen unit to emit light to realize an image display.

As mentioned above, the present invention proposes a splicing display screen. The splicing display screen is defined with a plurality of sub-areas. Each sub-area is correspondingly provided with a display screen unit and a driving IC, and each driving IC is correspondingly buried in a groove of a sub-area of the splicing display screen. In the present invention, by burying each driving IC in the groove of the corresponding sub-area of the splicing display screen, the seamless splicing of multiple display screen units can be realized without increasing the overall thickness of the splicing display screen. It can prevent the driving IC from being exposed to the air and being corroded and oxidized by water vapor. In addition, each display screen unit is provided with a corresponding driving IC, and the driving ICs in the same row or same column are connected in series to form multiple driving IC rows or driving IC columns, and each of the multiple driving IC rows or driving IC columns is respectively connected to the control unit. This can reduce a risk of IR Drop of a large-sized splicing display and improve the display effect.

The aforesaid content is just preferred embodiments of the present invention. For those of ordinary skill in the art, without departing from the principle of the present invention, several improvements and modifications can be made. These improvements and modifications should also be regarded as the protection scope of the present invention.

What is claimed is:

1. A splicing display screen defined with a plurality of sub-areas, comprising:
   a first substrate;
   a first flexible support layer disposed on the first substrate;
   a first metal layer disposed on the first flexible support layer;
   a first insulating layer disposed on the first metal layer;
   a plurality of driving ICs, wherein each driving IC corresponds to a sub-area, is disposed on the first flexible support layer, and electrically connected to a circuit of the first metal layer;
   a control unit electrically connected to the plurality of driving ICs; and
   a plurality of display screen units, wherein the plurality of display screen units correspond to the plurality of sub-areas in a one-to-one manner,
   wherein each sub-area is defined with a groove, the groove penetrates the first insulating layer, the first metal layer, and at least part of the first flexible support layer, and wherein each driving IC is disposed in a corresponding groove.

2. The splicing display screen of claim 1, wherein each sub-area further comprises:
   a first metal pad, wherein the first metal pad is disposed on the first insulating layer and is electrically connected to the first metal layer through a first via hole penetrating the first insulating layer; and
   a second metal pad, wherein the second metal pad is led out from a bottom of each display screen unit;
   wherein the first metal pad and the second metal pad are connected in a one-to-one correspondence to conduct the plurality of display screen units and the plurality of driving ICs.

3. The splicing display screen of claim 2, further comprising a glue layer filling the groove and a gap between the display screen unit and the first insulating layer.

4. The splicing display screen of claim 2, wherein the display screen unit comprises:
   a second substrate;
   a second metal layer disposed on the second substrate;
   a thin film transistor device layer disposed on the second metal layer;

a light-emitting device layer disposed on the thin film transistor device layer; and an encapsulation layer disposed on the light-emitting device layer;

wherein the second metal pad is electrically connected to the second metal layer through an opening on the second substrate, and the second metal layer is electrically connected to the thin film transistor device layer through a third via hole.

5. The splicing display screen of claim 1, wherein the plurality of driving ICs in same row are connected in series to form at least two driving IC rows, and the at least two driving IC rows are respectively electrically connected to the control unit.

6. A splicing display screen defined with a plurality of sub-areas, comprising:

a first substrate;

a first flexible support layer disposed on the first substrate;

a first metal layer disposed on the first flexible support layer;

a plurality of driving ICs, wherein each driving IC corresponds to a sub-area, is disposed on the first flexible support layer, and electrically connected to a circuit of the first metal layer;

a control unit electrically connected to the plurality of driving ICs;

a first insulating layer disposed on the first metal layer;

a second flexible support layer disposed on the first insulating layer;

a second insulating layer disposed on the second flexible support layer; and a plurality of display screen units, wherein the plurality of display screen units correspond to the plurality of sub-areas in a one-to-one manner, and the plurality of display screen units are disposed on the second insulating layer and electrically connected to the first metal layer, wherein each sub-area is defined with a groove, the groove penetrates the second insulating layer, the second flexible support layer, the first insulating layer, the first metal layer, and at least part of the first flexible support layer, and wherein each driving IC is disposed in a corresponding groove.

7. The splicing display screen of claim 6, wherein each sub-area further comprises:

a first metal pad disposed on the second insulating layer and is electrically connected to the first metal layer through a second via hole penetrating the second insulating layer, the second flexible support layer, and the first insulating layer; and a second metal pad, wherein the second metal pad is led out from a bottom of each display screen unit;

wherein the first metal pad and the second metal pad are connected in a one-to-one correspondence to conduct the plurality of display screen units and the plurality of driving ICs.

8. The splicing display screen of claim 7, further comprising a glue layer filling the groove and a gap between the display screen unit and the first insulating layer.

9. The splicing display screen of claim 7, wherein the display screen unit comprises:

a second substrate;

a second metal layer disposed on the second substrate;

a thin film transistor device layer disposed on the second metal layer;

a light-emitting device layer disposed on the thin film transistor device layer; and an encapsulation layer disposed on the light-emitting device layer;

wherein the second metal pad is electrically connected to the second metal layer through an opening on the second substrate, and the second metal layer is electrically connected to the thin film transistor device layer through a third via hole.

10. The splicing display screen of claim 6, wherein the plurality of driving ICs in same row are connected in series to form at least two driving IC rows, and the at least two driving IC rows are respectively electrically connected to the control unit.

* * * * *